(12) United States Patent
Mann

(10) Patent No.: US 7,973,908 B2
(45) Date of Patent: Jul. 5, 2011

(54) SIX-MIRROR EUV PROJECTION SYSTEM WITH LOW INCIDENCE ANGLES

(75) Inventor: Hans-Juergen Mann, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 646 days.

(21) Appl. No.: 11/913,598

(22) PCT Filed: May 10, 2006

(86) PCT No.: PCT/EP2006/004354
§ 371 (c)(1),
(2), (4) Date: May 9, 2008

(87) PCT Pub. No.: WO2006/119977
PCT Pub. Date: Nov. 16, 2006

(65) Prior Publication Data
US 2009/0079952 A1    Mar. 26, 2009

Related U.S. Application Data

(60) Provisional application No. 60/680,663, filed on May 13, 2005.

(51) Int. Cl.
*G03B 27/42* (2006.01)
(52) U.S. Cl. .......................... 355/53; 355/30
(58) Field of Classification Search .................. 355/30, 355/53
See application file for complete search history.

(56) References Cited

U.S. PATENT DOCUMENTS

| 5,071,240 | A  | * | 12/1991 | Ichihara et al. ............... 359/366 |
| 5,686,728 | A  |   | 11/1997 | Shafer |
| 6,033,079 | A  | * | 3/2000  | Hudyma ....................... 359/857 |
| 6,195,201 | B1 |   | 2/2001  | Kock et al. |
| 6,198,793 | B1 |   | 3/2001  | Schultz et al. |
| 6,781,671 | B2 |   | 8/2004  | Komatsuda |

FOREIGN PATENT DOCUMENTS

| EP | 1 209 503 | 5/2002 |
| EP | 1 450 209 | 8/2004 |
| WO | 2004-010224 | 1/2004 |
| WO | WO 2004/010224 | 1/2004 |

OTHER PUBLICATIONS

Bal, Matthieu Frédéric, dissertation "Next-Generation Extreme Ultraviolet Lithographic Projection Systems", pp. 1-139, (Feb. 10, 2003).

* cited by examiner

*Primary Examiner* — Edward J Glick
*Assistant Examiner* — Mesfin T Asfaw
(74) *Attorney, Agent, or Firm* — Fish & Richardson P.C.

(57) ABSTRACT

The invention relates to a projection system for guiding light with wavelengths $\leq 193$ nm from an object plane to an image plane, comprising at least a first mirror, a second mirror, a third mirror, a fourth mirror, a fifth mirror and a sixth mirror centered around an optical axis and being arranged along the optical axis, with the light traveling from the object plane to the first mirror, then from the first mirror to the second mirror then from the second mirror to the third mirror, then from the third mirror, the fourth mirror, then from the fourth mirror to the fifth mirror and then from the fifth mirror to the sixth mirror. The invention is characterized in that the first mirror is arranged along the optical axis geometrically between the fifth mirror and the sixth mirror, and the third mirror is a convex mirror.

16 Claims, 8 Drawing Sheets

SIX-MIRROR EUV PROJECTION SYSTEM WITH LOW INCIDENCE ANGLES

CROSS REFERENCE TO RELATED APPLICATIONS

This application is a National Phase application under 35 U.S.C. 371 filed from International Patent Application Serial No. PCT/EP2006/004354, filed on May 10, 2006, which claims benefit of U.S. provisional application 60/680,663 filed May 13, 2005 in the US-Patent and Trademark office. The content of the U.S. provisional application 60/680,663 is incorporated herein in its entirety.

BACKGROUND OF THE INVENTION

1. Field of the Invention

The invention relates to a projection objective for wavelengths $\leq 193$ nm with at least six mirrors which are arranged along an optical axis.

2. Description of Related Art

One central problem in the design of EUV lithographic systems is the transmission of the system, both in the area of the illumination as well as the projection system. The transmission is determined by two factors: on the one hand, by the number of the optical elements, e.g. normal-incidence and grazing-incidence mirrors, filters, etc., and on the other hand by the reflectivity of the optical elements. In order to optimize the transmission it is necessary both to minimize the number of the optical elements as well as maximize the reflectivity of every single optical element. Preferably this occurs under consideration of the respective boundary conditions, especially the system specifications concerning the imaging power and the aspects concerning construction and production.

One possibility to reduce the number of the optical elements is to choose the intersection distance or the intercept distance of the entrance pupil of the projection lens system to be negative. This has been described in WO 2004/010224 A2. In the illumination system as known from WO 2004/010224, it is possible to omit normal-incidence mirrors within the illumination system relative to systems with positive intersection distance or intercept distance leading to a double of the transmission of the system. However, first projection systems as shown in this application show a very small working distance on the object side, so that it is not possible or with much difficulty to couple in an illuminating beam. Although the other system shown in WO 2004/01024 A2 has a large working distance on the object side of approximately 400 mm, the incidence angles on the first three mirrors are so large that the reflectivity of these mirrors is comparatively small.

In the projection system as shown in WO 2004/010224 with negative intersection distance or intercept distance the embodiments with small incidence angles have a maximum distance between reticle and second mirror M2 of approximately 226 mm at an overall length of 1500 mm. This corresponds to a value of the free working distance of approximately 15% of the overall length of the projection system. The embodiment with large incidence angles comprises a distance between reticle and mirror of 400 mm.

A system with negative intersection distance is also shown by the specification U.S. Pat. No. 6,781,671 B2. The entrance pupil also has a negative intersection distance in this case too. The incidence angles especially on the mirrors M22, M24 and M25 are so large that the reflection losses on these mirrors are very high. The six-mirror projection objective as shown in U.S. Pat. No. 6,781,671 B2 comprises a working distance on the object side of approximately 29 mm at an overall length of 698 mm, i.e. the working distance is only 4.2% of the overall length of the objective and has a very large incidence angle $>20°$. The six-mirror system of U.S. Pat. No. 6,781,671 B2 has a distance between reticle and second mirror of 55 mm, i.e. 7.9% of the overall length.

The U.S. Pat. No. 6,033,079 shows a projection system with minimized incidence angles, so that in the case of choosing a respectively adjusted coating the reflectivity of the individual mirrors and thus the transmission of the projection lens system is maximal. However, the systems known from U.S. Pat. No. 6,033,079 have a positive intersection distance of the entrance pupil, so that the illumination system shows very high losses as a result of this positive intersection distance.

SUMMARY OF THE INVENTION

It is therefore an object of the present invention to overcome disadvantages of the state of the art. A projection system is to be provided in particular which combines the advantageous properties of a negative intersection distance or intercept distance of the entrance pupil with small incidence angles. Moreover, simple coupling in of the illumination shall be enabled.

This object is achieved in accordance with the invention by a projection objective or projection system according to the features of the claims 1, 2, 3 or 4.

In a first embodiment of the invention a projection system is provided having at least six mirrors. The six mirrors are arranged along an optical axis HA. The six mirrors are each centered around the optical axis and furthermore each mirror has a mirror surface onto which light, which travels form an object plane of the projection system to an image plane impinges. Each mirror has a vertex, defined by the intersection point of each mirror surface with the optical axis. The six mirrors are arranged in a light path of light traveling from the object plane to the image plane such, that the light from the object plane impinges on the first mirror, is reflected by the first mirror surface and travels from the first mirror to the second mirror, is reflected by the second mirror surface and travels from the second mirror to the third mirror, is reflected by the third mirror surface and travels from the third mirror to the fourth mirror, is reflected by the fourth mirror surface and travels from the fourth mirror to the fifth mirror, is reflected by the fifth mirror surface and travels form the fifth mirror to the sixth mirror, is reflected by the sixth mirror surface and travels form the sixth mirror in a first alternative directly to the image plane or in a second alternative via other optical elements, such as further mirrors to the image plane.

In this application a distance between mirrors or mirrors and planes, such as the object plane is a distance of the vertices of two mirrors or a distance between the vertex of a mirror and a plane along the optical axis.

According to one object of the invention along the optical axis the first mirror is situated geometrically between the fifth mirror and the sixth mirror. Furthermore the third mirror is a convex mirror.

In a further embodiment of the invention, the third mirror, the fourth mirror and the sixth mirror are arranged spatially or geometrically between the first and the second mirror.

As a result in the above mentioned embodiments of a projection system with at least six mirrors, a large distance can be achieved between the object plane and the mirror spatially closest to the object plane. Such a large distance provides for a large working space at the object side of the projection system. An arrangement of the third, fourth and sixth mirror along the optical axis between the first and the second mirror leads to the advantage that the arrangement produces a large spatial distance between first mirror M1 and the second mirror M2, which on leads to small incidence angles on the first and second mirror.

Furthermore, a large spatial distance between the object plane and the mirror closest to the object plane can be achieved by the embodiments described above. This leaves sufficient space in order to e.g. arrange a grazing-incidence mirror in front of the object plane for example, which allows coupling in a beam of light.

It is preferable when the free working distance on the object side is more than 8%, most preferable more than 16%, more preferable more than 20%, most preferable more than 25% of the overall length of the objective. The working distance on the object side shall be understood as the axial distance between the object plane and the mirror closest to the object plane in which the reticle is situated. The mirror closest to the object plane is preferably either the second or fourth mirror.

In absolute values the distance between the Object plane and the mirror next to the object plane, e.g. the mirror M2 or the mirror M4 is greater or equal than 160 nm, preferably greater or equal than 360 nm, most preferably greater or equal than 520 nm.

Preferably, the incidence angles of a chief ray to a central field point on the first mirror M1 relative to the normal is smaller than 4°, smaller than 14° on the second mirror M2 and smaller than 18° on the third mirror M3.

If the fourth mirror M4 is the mirror closest to the object plane, in which the reticle is situated within the terms of the above definition, the distance between the object plane and the second mirror is important for coupling in an illumination beam.

Preferably, the distance of the second mirror in the beam path to the object plane in which the reticle is situated in such a case is more than 16% more preferable more than 20%, most preferable more than 25% of the overall length of the projection objective.

In a preferred embodiment of the invention, a chief ray (CR) of electromagnetic radiation, which is reflected by an object arranged in the object plane, runs in the projection objective or projection system from the optical axis away in the direction of an image situated in the image plane and the distance of the second mirror (M2) from the object plane is more than 16%, preferably more than 20%, most preferably more than 25% of the overall length of the objective, with the overall length of the objective being the distance along the optical axis, from the object plane to the image plane. Preferably a chief ray (CR) to a central field point impinges upon each mirror under an incidence angle of <25°, preferably <20° and more preferably <18° relative to the normal of a mirror surface at a point at which the chief ray (CR) impinges onto the mirror surface.

In another preferred embodiment, a chief ray (CR) of electromagnetic radiation, which is reflected by an object arranged in the object plane, runs in the projection objective from the optical axis away in the direction of an image in an image plane and the distance of the mirror closest to the object (which is also known as reticle in microlithographic systems) from the object plane is more than 8%, preferably more than 15%, more preferably more than 20% of the overall length of the objective, with the overall length of the objective being the distance of the object plane to the image plane and a chief ray (CR) associated to a central field point impinges upon each mirror under an incidence angle of <25°, preferably <20° and more preferably <18° relative to the normal of a mirror surface at a point at which the chief ray (CR) impinges onto the mirror surface.

Preferably, the numeric aperture (NA) of the projection objective on the image side is equal or more than 0.2, preferably equal or more than 0.3, most preferably equal or more than 0.35. The stop of the projection objective preferably lies between the second and the third mirror.

The stop is preferably arranged as an accessible stop, preferably an iris stop.

In a first embodiment of the invention, the second mirror is plane or convex or concave.

In a further embodiment of the invention the third mirror is a convex mirror.

In a further embodiment the fourth mirror is a concave mirror.

Projection objectives are preferable in which the fifth mirror is provided as a convex mirror.

In a further embodiment of the projection objective, the sixth mirror is a concave mirror.

In a further embodiment the first mirror is a concave mirror.

Preferably the projection system are reduction system, which means that an object field in the object plane is imaged in a image field reduced by a predetermined factor in relation to the object field, for example by a factor of 4 for a 4:1 projection system or a factor of 5 for 5:1 projection system.

In addition to the projection objective, the invention also provides a projection exposure system for microlithography with wavelengths ≦193 nm, comprising a light source, an illumination system with a field plane in which a field comprising a plurality of field points is formed and illuminated. From each field point of a field a chief ray is emanating. The microlithography projection exposure system further comprises a projection objective in accordance with the invention. An object in the field plane is projected into an image in an image plane of the projection system with the help of a projection system in accordance with the invention. The object preferably is a structured mask, especially a reticle. The projection objective or projection system according to the invention is characterized in that it comprises an optical axis and chief rays (CR) associated to each field point of a field in the object plan run into the projection objective in a divergent manner in a direction of light with respect to the optical axis. In a scanner type projection exposure system the field in the field plane which is illuminated is provided as a ring field with an axis of symmetry and a central field point as well known to a person skilled in the art and e.g. shown in WO 2004/010224, FIG. 1. The disclosure content of WO 2004/010224 is incorporated herein by reference.

Microelectronic components or parts thereof can be produced with the help of the projection exposure system. A structured mask is projected onto a light-sensitive layer situated in the image plane of the projection objective with the help of the projection exposure system and the structured mask is developed, resulting in a part of a microelectronic component or the microelectronic component per se.

BRIEF DESCRIPTION OF THE DRAWINGS

The invention is described below by reference to the embodiments shown in the drawings, wherein:

The first embodiment shown in FIG. 1 shows a six-mirror projection objective or projection system with an image-side aperture of NA=0.25 and an image-side field size of 2×26 mm². The image side slit length is then 2 mm. The field is an arc-shaped field or so called ring field as known to a man skilled in the art. The arc-shaped field as a man skilled in the art knows e.g from WO 2004/010224, FIG. 1 and description thereof has a central field point, which is a origin for a x-, y-, z-coordinate system in the object plane. Furthermore in an exemplary embodiment in FIG. 8 of this application a ring field is shown. The entrance pupil of the projection system lies in FIG. 1 to the left of the object plane and therefore the projection system comprises a negative intersection distance, i.e. the chief rays emanating from a field in an object plane run in a divergent manner into the projection objective or projection system. In FIG. 1, the reference numeral 1 designates the object plane, 3 the image plane, M1 the first mirror, M2 the second mirror, M3 the third mirror, M4 the fourth mirror, M5 the fifth mirror M6 the sixth mirror, HA the optical axis and CR the chief ray to the central field point of the ring field in the object plane. An intermediate image Z is provided between the fourth and fifth mirror.

In the object plane for all embodiments shown in FIG. 1 to FIG. 6 the y-direction and the z-direction of an x-, y-, z-coordinate system is shown. FIG. 1 to FIG. 6 show a meridional section of a projection objective or projection system. In a ringfield-scanner the y-direction is coincident with the scanning direction. Furthermore in all embodiments shown in FIG. 1 to 6 only the used areas of the mirrors are depicted. The used areas of the mirrors are those areas onto which light traveling from the object side to the image side of the projection system is impinging on a mirror surface. Furthermore for each mirror the mirror surface MS1, MS2, MS3, MS4, MS5, MS6 is shown as calculated e.g. with a program such as Code V. Each mirror surface MS1, MS2, MS3, MS4, MS5, MS6 intersects the optical axis, defining a vertex V1, V2, V3, V4, V5, V6 of each mirror M1, M2, M3, M4, M5, M6. The distance between e.g. the mirror M2 and the object plane 1 is then defined by the distance of the vertex V2 to the object plane 1 along the optical axis HA. The distance between the object plane 1 and the mirror closest, here the mirror M2 to the object plane is as defined above 360 mm and allows coupling in an illumination beam by way of a grazing-incidence mirror 10 which is shown in FIG. 7. The grazing-incidence-mirror 10 is arranged directly in front of the object plane in which the reticle is situated. The wavefront error of the system is less than 0.015λ r.m.s. and the static distortion is corrected to less than 3 nm. The incidence angles of the chief ray CR of the central field point on to the individual mirrors are shown together with the asphericities and aspheric gradients in the following Table 1:

TABLE 1

Figure 1:
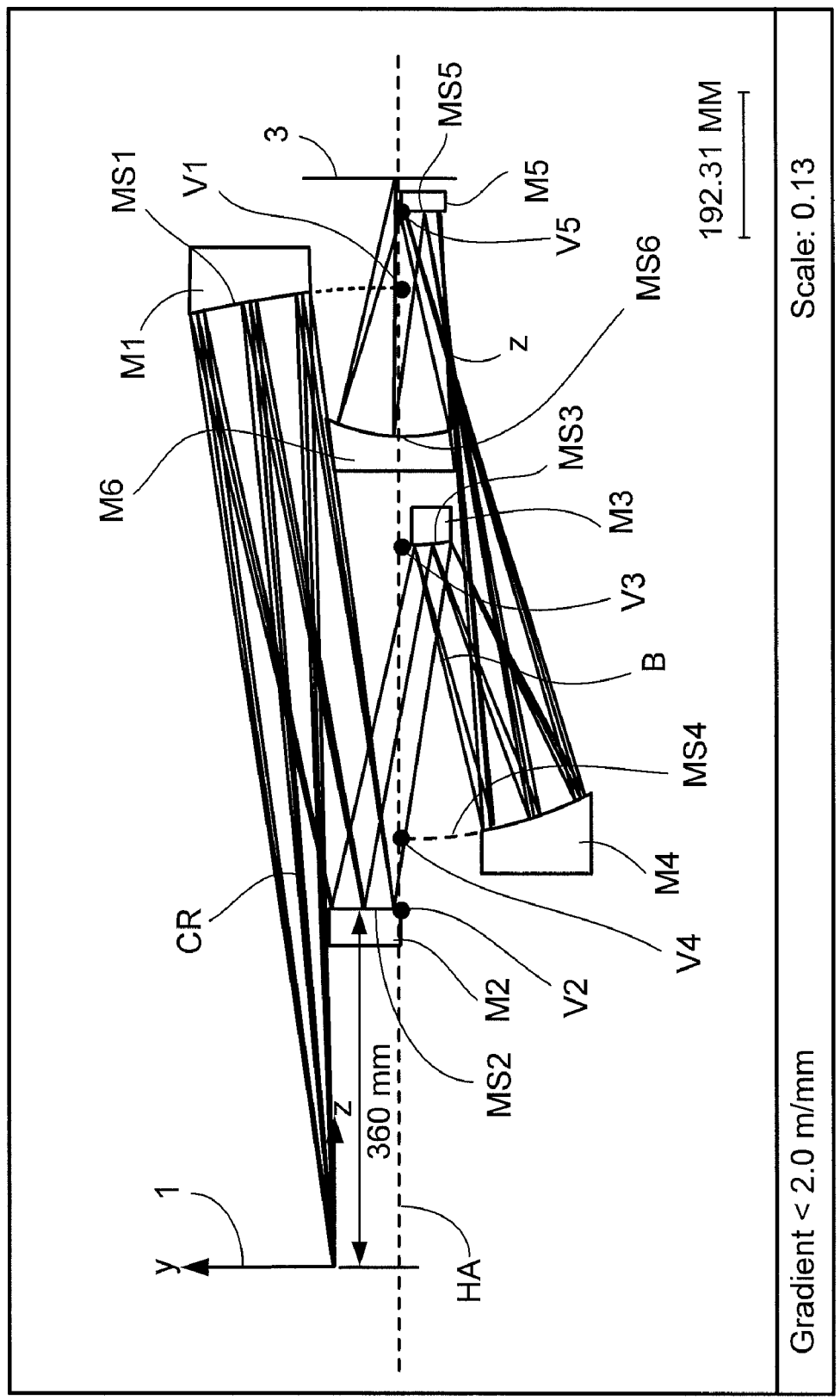
FIG. 1 shows a first embodiment of a projection system in accordance with the invention.

Aspheriricity, aspheric gradient and incidence angle of the embodiment shown in FIG. 1.

| Mirror | Incidence angle [°] of the chief ray CR | Asphericity [μm] | Gradient [μm/mm] |
| --- | --- | --- | --- |
| 1 | 3.05 | 31.4 | 0.90 |
| 2 | 11.95 | 22.8 | 1.45 |
| 3 | 17.44 | 17.7 | 2.00 |
| 4 | 5.39 | 7.6 | 0.30 |
| 5 | 10.33 | 11.0 | 1.98 |
| 6 | 4.24 | 6.0 | 0.40 |

The aperture stop B of the system is located in the beam path between the second mirror M2 and the third mirror M3. It is passed by the bundle of light easily, so that no vignetting effects occur, as are known from systems in which the stop is located directly in front of a mirror. As a result of the space available above and below the stop, the aperture stop B can also be configured as an iris stop. The optical data in Code-V-Format of the system according to embodiment 1 (FIG. 1) are shown in Table 2:

TABLE 2

| Surface | Radius | Thickness | Mode |
| --- | --- | --- | --- |
| Object | INFINITY | 1351.812 | |
| Mirror 1 | −1609.941 | −862.328 | REFL |
| Mirror 2 | −32274.534 | 341.926 | REFL |
| STOP | INFINITY | 170.402 | |
| Mirror 3 | 362.594 | −412.328 | REFL |
| Mirror 4 | 655.909 | 865.517 | REFL |
| Mirror 5 | 502.855 | −303.188 | REFL |
| Mirror 6 | 379.839 | 348.188 | REFL |
| Image | INFINITY | 0.000 | |

| Surface | K | A | B | C |
| --- | --- | --- | --- | --- |
| Mirror 1 | 4.23267E−01 | 0.00000E+00 | −2.71320E−18 | −3.71861E−23 |
| Mirror 2 | 0.00000E+00 | −4.17915E−10 | −1.15185E−15 | −1.14119E−20 |
| Mirror 3 | 0.00000E+00 | −4.10814E−09 | −1.63054E−15 | 8.77156E−19 |
| Mirror 4 | 0.00000E+00 | 4.63505E−12 | 2.65424E−17 | 1.07460E−22 |
| Mirror 5 | 0.00000E+00 | 1.55594E−08 | 2.38130E−13 | −1.22439E−17 |
| Mirror 6 | 0.00000E+00 | 1.21305E−10 | 1.19693E−15 | 9.38799E−21 |

| Surface | D | E | F | G |
| --- | --- | --- | --- | --- |
| Mirror 1 | 3.51126E−28 | −1.77767E−33 | 3.61049E−39 | 0.00000E+00 |
| Mirror 2 | 8.38563E−25 | −4.09092E−29 | 8.42185E−34 | 0.00000E+00 |
| Mirror 3 | −3.23574E−22 | 5.86002E−26 | −3.98152E−30 | 0.00000E+00 |
| Mirror 4 | −4.81883E−28 | 6.95403E−33 | −1.87310E−38 | 0.00000E+00 |
| Mirror 5 | 9.52770E−21 | −2.65653E−24 | 4.10045E−28 | 0.00000E+00 |
| Mirror 6 | 6.68586E−26 | 1.78686E−30 | −5.29356E−35 | 0.00000E+00 |

Figure 2:
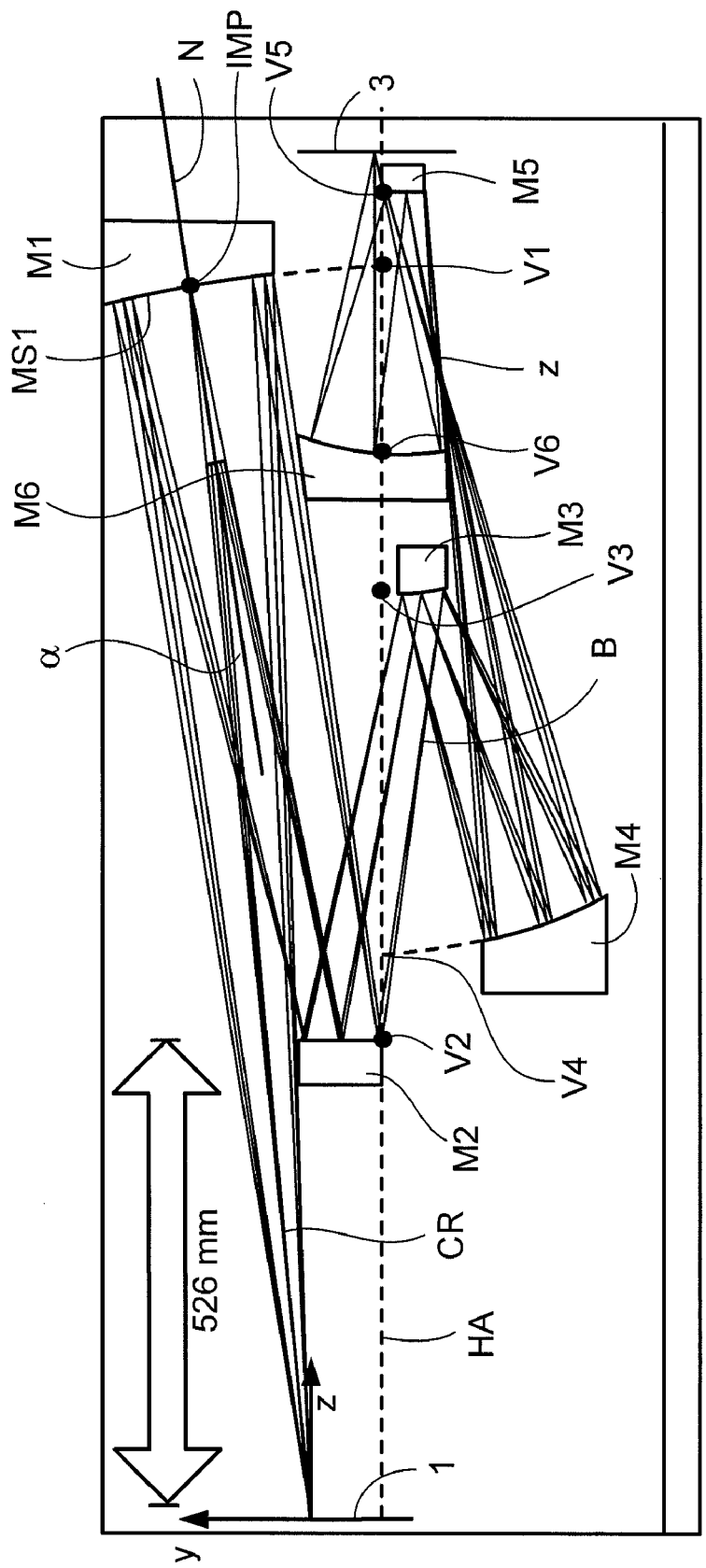
FIG. 2 shows a second embodiment of a projection system in accordance with the invention.

FIG. 2 shows a second embodiment. FIG. 2 shows a system analogous to embodiment 1, but in which the overall space between the object plane 1 and the mirror closest to the object plane was enlarged even further. The distance between object plane 1 and the reflecting surface of the second mirror M2 is 526 mm. This allows not only the installation of a grazing-incidence mirror in the illumination system, but also provides space for the installation e. g. of a optical element for improving the field uniformity in the object plane, such as e. g. a so called Unicom. Components similar in FIG. 1 are marked with the same reference numerals. In FIG. 2 is shown as an example for all other embodiments depicted in FIGS. 1 to 7 how the incidence angle of a chief ray CR to a central field point is defined in this application. This is shown as an example for mirror M1. The chief ray CR impinges onto the mirror surface MS1 of mirror M1 in a point IMP. In the point IMP a normal N onto the mirror surface MS 1 is defined. The incidence angle of the chief ray CR to the central field point relative to the normal N is then denoted by $\alpha$.

For this example too the data have been compiled for incidence angles, asphericities and aspheric gradients in the following Table 3:

The optical data for embodiment 2 (FIG. 2) in Code-V-Format are shown in Table 4:

TABLE 4

| Surface | Radius | Thickness | Mode |
|---|---|---|---|
| Object | INFINITY | 1369.621 | |
| Mirror 1 | −1565.388 | −842.669 | REFL |
| Mirror 2 | −15703.249 | 328.922 | REFL |
| STOP | INFINITY | 163.747 | |
| Mirror 3 | 352.189 | −392.669 | REFL |
| Mirror 4 | 626.221 | 828.048 | REFL |
| Mirror 5 | 473.887 | −285.379 | REFL |
| Mirror 6 | 360.755 | 330.379 | REFL |
| Image | INFINITY | 0.000 | |

| Surface | K | A | B | C |
|---|---|---|---|---|
| Mirror 1 | 3.63157E−01 | 0.00000E+00 | −3.02378E−18 | −3.47665E−23 |
| Mirror 2 | 0.00000E+00 | −4.74840E−10 | −1.15814E−15 | −1.50045E−20 |
| Mirror 3 | 0.00000E+00 | −4.75853E−09 | −8.77224E−15 | 2.19527E−18 |
| Mirror 4 | 0.00000E+00 | 5.58470E−12 | 3.44256E−17 | 1.17637E−22 |
| Mirror 5 | 0.00000E+00 | 1.63993E−08 | 3.15576E−13 | −1.43630E−17 |
| Mirror 6 | 0.00000E+00 | 1.47089E−10 | 1.59277E−15 | 1.40491E−20 |

| Surface | D | E | F | G |
|---|---|---|---|---|
| Mirror 1 | 3.26430E−28 | −1.70632E−33 | 3.55014E−39 | 0.00000E+00 |
| Mirror 2 | 9.92209E−25 | −5.68771E−29 | 1.32214E−33 | 0.00000E+00 |
| Mirror 3 | −7.05786E−22 | 1.26194E−25 | −8.94279E−30 | 0.00000E+00 |
| Mirror 4 | −1.49569E−28 | 7.03255E−33 | −1.85310E−38 | 0.00000E+00 |
| Mirror 5 | 1.02591E−20 | −3.10467E−24 | 5.68288E−28 | 0.00000E+00 |
| Mirror 6 | 1.02063E−25 | 3.43323E−30 | −1.09955E−34 | 0.00000E+00 |

Figure 3:
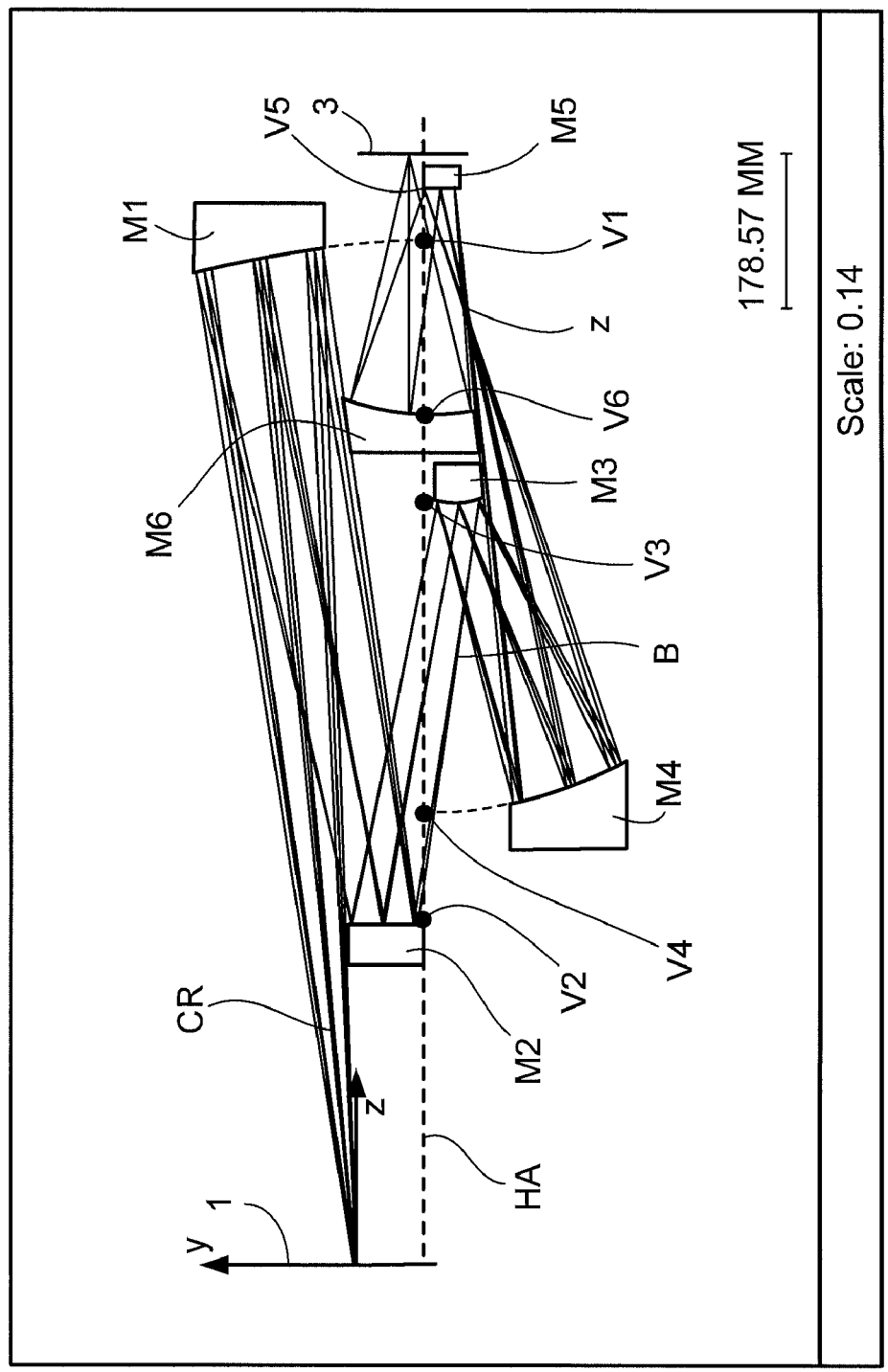
FIG. 3 shows a third embodiment of a projection system in accordance with the invention.

The third embodiment shown in FIG. 3 shows a system comparable to the two preceding examples. However, the residual wavefront error is corrected to 0.006λ in this system and the distortion to less than 0.1 nm. The incidence angles were also reduced considerably. The same components are designated with the same reference numerals as in FIGS. 1 and 2.

In comparison with the two other systems however a higher aspheric gradient was required, as is clearly shown by the following Table 5:

TABLE3

Asphericity, aspheric gradient and incidence angle of the embodiment shown in FIG. 2.

| Mirror | Incidence angle [°] of the chief ray CR | Asphericity [μm] | Gradient [μm/mm] |
|---|---|---|---|
| 1 | 3.15 | 29.3 | 0.83 |
| 2 | 12.03 | 22.0 | 1.45 |
| 3 | 17.31 | 16.7 | 2.00 |
| 4 | 5.34 | 6.8 | 0.28 |
| 5 | 10.25 | 9.6 | 1.82 |
| 6 | 4.23 | 5.9 | 0.41 |

In this embodiment too the maximum aspheric gradient was limited to a value of 2.0 μm/mm.

TABLE 5

Asphericity, aspheric gradient and incidence angle of the embodiment shown in FIG. 3:

| Mirror | Incidence angle [°] of the chief ray CR | Asphericity [μm] | Gradient [μm/mm] |
|---|---|---|---|
| 1 | 2.81 | 26.3 | 0.77 |
| 2 | 11.28 | 24.1 | 1.58 |
| 3 | 16.75 | 27.5 | 2.94 |
| 4 | 4.79 | 2.2 | 0.09 |
| 5 | 10.72 | 6.5 | 1.30 |
| 6 | 4.31 | 4.1 | 0.29 |

The comparison of the three embodiments clearly show that the aspheric gradient of the third mirror M3 has a relevant influence on the projection quality, measured e. g. as residual wavefront error and distortion.

The optical data in Code-V-Format of the system according to FIG. 3 are summarized in Table 6:

TABLE 6

| Surface | Radius | Thickness | Mode |
|---|---|---|---|
| Object | INFINITY | 1317.116 | |
| Mirror 1 | −1589.605 | −877.907 | REFL |
| Mirror 2 | −11645.993 | 340.348 | REFL |
| STOP | INFINITY | 205.297 | |
| Mirror 3 | 388.816 | −400.038 | REFL |
| Mirror 4 | 636.758 | 800.266 | REFL |
| Mirror 5 | 421.528 | −285.049 | REFL |
| Mirror 6 | 353.946 | 330.049 | REFL |
| Image | INFINITY | 0.000 | |

| Surface | K | A | B | C |
|---|---|---|---|---|
| Mirror 1 | 4.08397E−01 | 0.00000E+00 | −3.43763E−19 | −3.15626E−23 |
| Mirror 2 | 0.00000E+00 | −6.22333E−10 | 1.10006E−15 | −1.14188E−20 |
| Mirror 3 | 0.00000E+00 | −4.73123E−09 | −7.57742E−15 | −1.60433E−18 |
| Mirror 4 | 0.00000E+00 | 9.58342E−13 | 1.58161E−17 | −6.78562E−23 |
| Mirror 5 | 0.00000E+00 | 1.19730E−08 | 8.28981E−13 | 5.03681E−17 |
| Mirror 6 | 0.00000E+00 | 1.03260E−10 | 1.24408E−15 | 1.08016E−20 |

| Surface | D | E | F | G |
|---|---|---|---|---|
| Mirror 1 | 3.27420E−28 | −1.94480E−33 | 4.58997E−39 | 0.00000E+00 |
| Mirror 2 | −8.47836E−25 | 1.04648E−29 | 5.40739E−34 | 0.00000E+00 |
| Mirror 3 | 3.19943E−22 | −3.69084E−26 | 1.70004E−30 | 0.00000E+00 |
| Mirror 4 | 9.74604E−28 | −3.03590E−33 | 4.01551E−40 | 0.00000E+00 |
| Mirror 5 | −5.69090E−20 | 2.12758E−23 | −2.99602E−27 | 0.00000E+00 |
| Mirror 6 | 1.12231E−25 | −8.51792E−31 | 6.04440E−35 | 0.00000E+00 |

Figure 4:
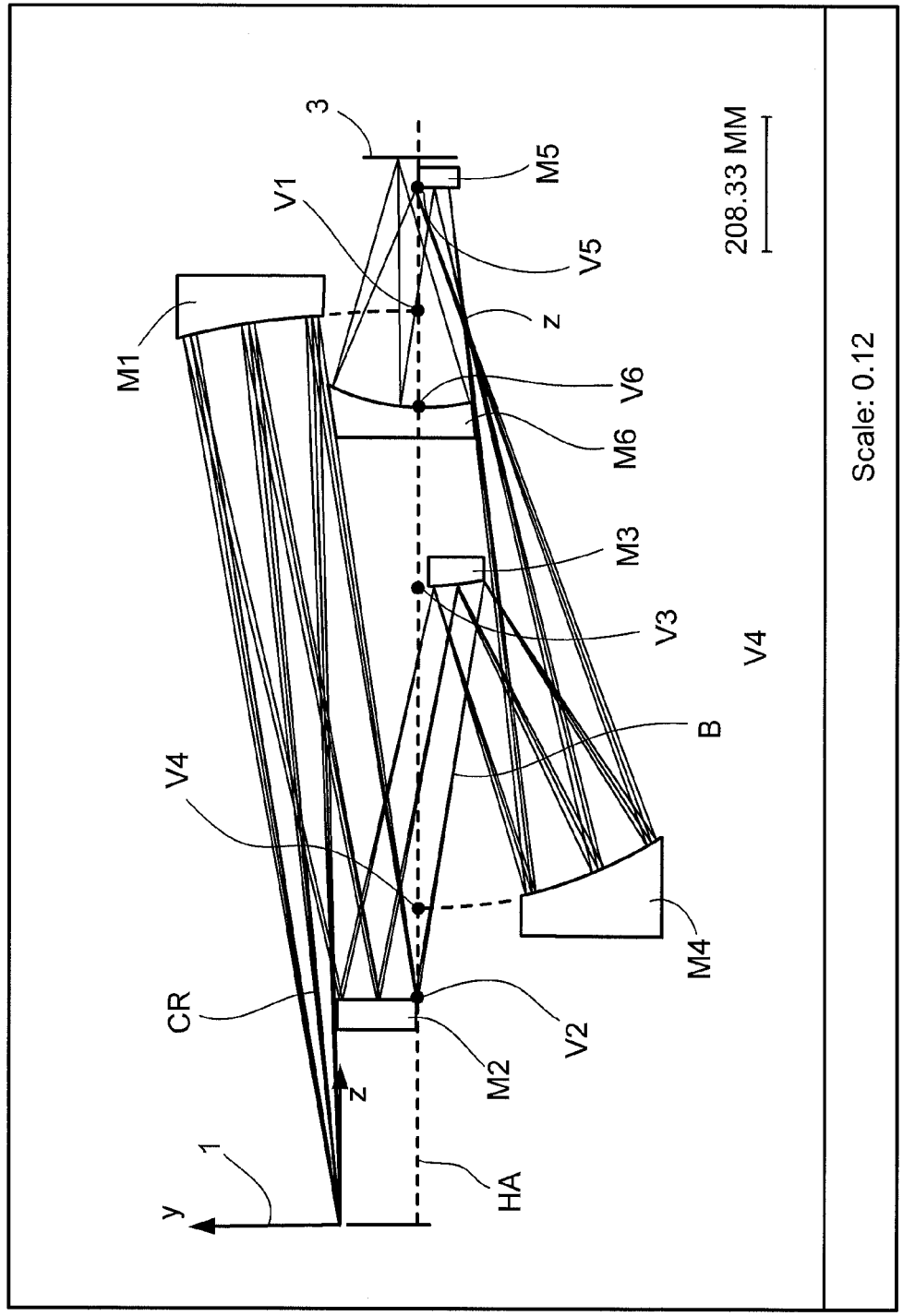
FIG. 4 shows a fourth embodiment of a projection system in accordance with the invention.

The fourth embodiment shows a six-mirror projection objective with a negative intersection distance of the entrance pupil and a numeric aperture on the image side of NA=0.30. The wavefront has a residual error of 0.017λ r.m.s. and the distortion is corrected to a maximum value of 1 nm. Such a system is shown in FIG. 4. The same components as in the preceding figures are designated with the same reference numerals.

Incidence angles, asphericities and aspheric gradients are compiled for this embodiment too in the following Table 7:

TABLE 7

Asphericity, aspheric gradient and incidence angle of the embodiment shown in FIG. 4

| Mirror | Incidence angle [°] of the chief ray CR | Asphericity [μm] | Gradient [μm/mm] |
|---|---|---|---|
| 1 | 2.86 | 40.7 | 0.95 |
| 2 | 11.69 | 35.3 | 1.84 |

TABLE 7-continued

Asphericity, aspheric gradient and incidence angle of the embodiment shown in FIG. 4

| Mirror | Incidence angle [°] of the chief ray CR | Asphericity [μm] | Gradient [μm/mm] |
|---|---|---|---|
| 3 | 19.60 | 79.7 | 5.57 |
| 4 | 6.54 | 24.0 | 0.58 |
| 5 | 11.98 | 18.7 | 2.62 |
| 6 | 4.85 | 12.2 | 0.63 |

A further feature of the embodiment shown in FIG. 4 is the fact that the second mirror M2 is provided with a paraxial flat configuration in the beam path, i.e. the basic curvature of the mirror parent is equal zero. Such a mirror is also denoted as a "off-axis used Schmidt mirror". The production process is thus simplified significantly. The optical data in Code-V-Format of the embodiment shown in FIG. 4 is given in the following Table 8:

TABLE 8

| Surface | Radius | Thickness | Mode |
|---|---|---|---|
| Object | INFINITY | 1460.227 | |
| Mirror 1 | −1926.605 | −1100.227 | REFL |
| Mirror 2 | INFINITY | 348.055 | REFL |
| STOP | INFINITY | 311.818 | |
| Mirror 3 | 463.223 | −509.339 | REFL |
| Mirror 4 | 846.367 | 1144.467 | REFL |
| Mirror 5 | 529.65 | −344.773 | REFL |
| Mirror 6 | 427.755 | 389.773 | REFL |
| Image | INFINITY | 0.000 | |

| Surface | K | A | B | C |
|---|---|---|---|---|
| Mirror 1 | 0.00000E+00 | −7.76222E−12 | −3.72360E−18 | −5.95789E−24 |
| Mirror 2 | 0.00000E+00 | −3.83714E−10 | 6.75056E−16 | −1.83041E−20 |

TABLE 8-continued

| Mirror 3 | 0.00000E+00 | −2.45196E−09 | −1.97744E−15 | −6.02976E−20 |
| Mirror 4 | 0.00000E+00 | −4.97207E−12 | −3.93262E−18 | −1.15348E−23 |
| Mirror 5 | 0.00000E+00 | 7.93981E−09 | 3.07451E−13 | −4.61417E−18 |
| Mirror 6 | 0.00000E+00 | 7.86934E−11 | 6.06260E−16 | 3.62948E−21 |

| Surface | D | E | F | G |
| --- | --- | --- | --- | --- |
| Mirror 1 | 1.80269E−29 | −3.49309E−35 | 0.00000E+00 | 0.00000E+00 |
| Mirror 2 | 1.91415E−25 | −2.11927E−30 | 0.00000E+00 | 0.00000E+00 |
| Mirror 3 | 2.76068E−24 | −5.88166E−29 | 0.00000E+00 | 0.00000E+00 |
| Mirror 4 | 1.49379E−29 | −2.47933E−35 | 0.00000E+00 | 0.00000E+00 |
| Mirror 5 | −1.43339E−22 | 3.46600E−26 | 0.00000E+00 | 0.00000E+00 |
| Mirror 6 | 2.13670E−26 | 1.59387E−31 | 0.00000E+00 | 0.00000E+00 |

The fifth embodiment shows a six-mirror projection system with a high numeric aperture on the image side of NA=0.35 and a image side scan slit length of 1 mm. The residual error of the wave front is approx. 0.040λ r.m.s. and the distortion is corrected to a maximum value of 2 nm. Such a system is shown in FIG. 5.

Incidence angles, asphericities and gradients are shown here too in the following Table 9:

TABLE 9

Figure 5:
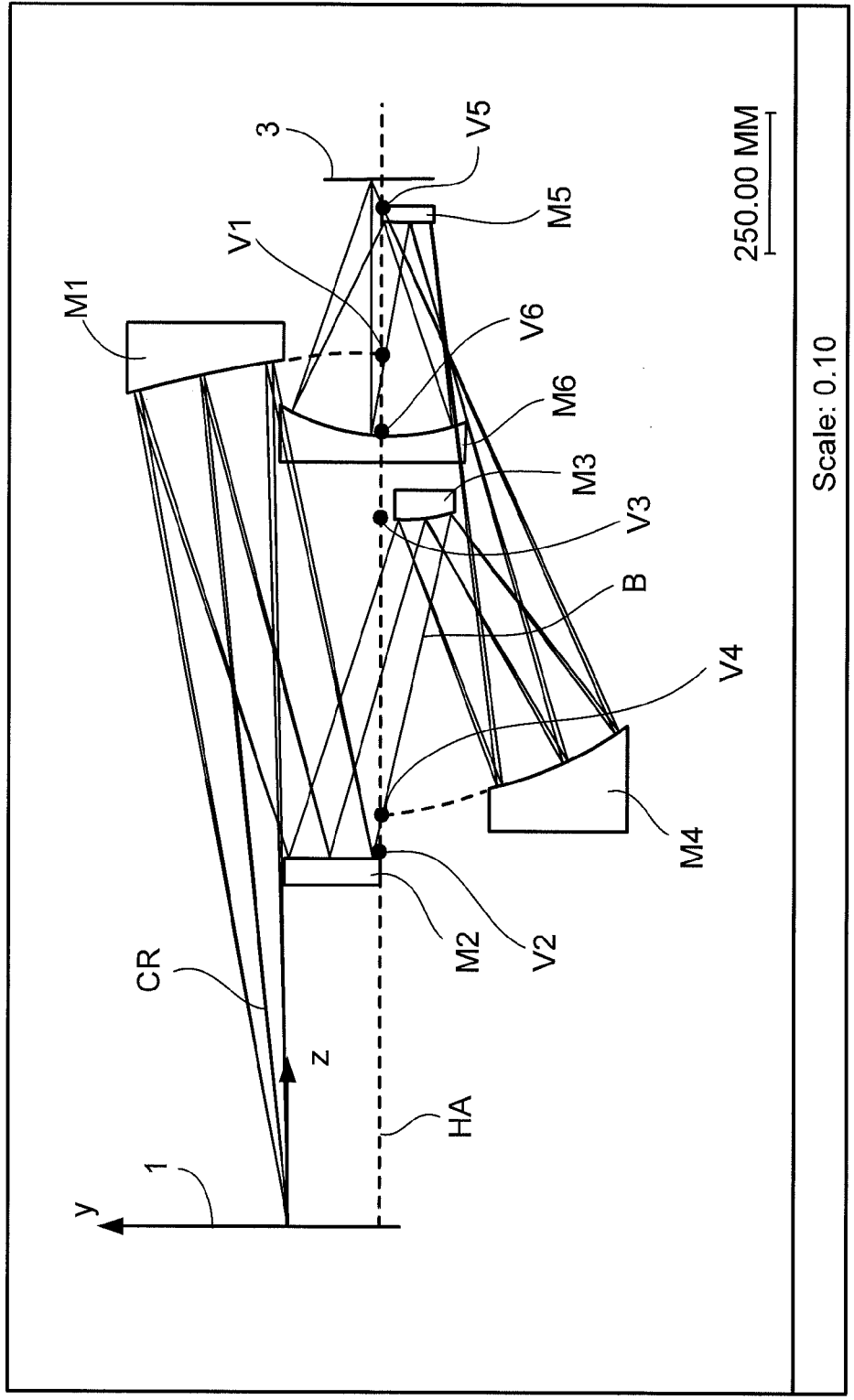
FIG. 5 shows a fifth embodiment of a projection system in accordance with the invention.

Asphericities, aspheric gradients and incidence angel of the embodiment shown in FIG. 5

| Mirror | Incidence angle [°] of the chief ray CR | Asphericity [µm] | Gradient [µm/mm] |
| --- | --- | --- | --- |
| 1 | 4.87 | 113.6 | 2.22 |
| 2 | 16.76 | 123.6 | 4.50 |
| 3 | 24.15 | 100.5 | 6.60 |
| 4 | 7.01 | 21.7 | 0.60 |
| 5 | 14.43 | 28.9 | 3.14 |
| 6 | 5.93 | 26.4 | 1.05 |

Figure 6:
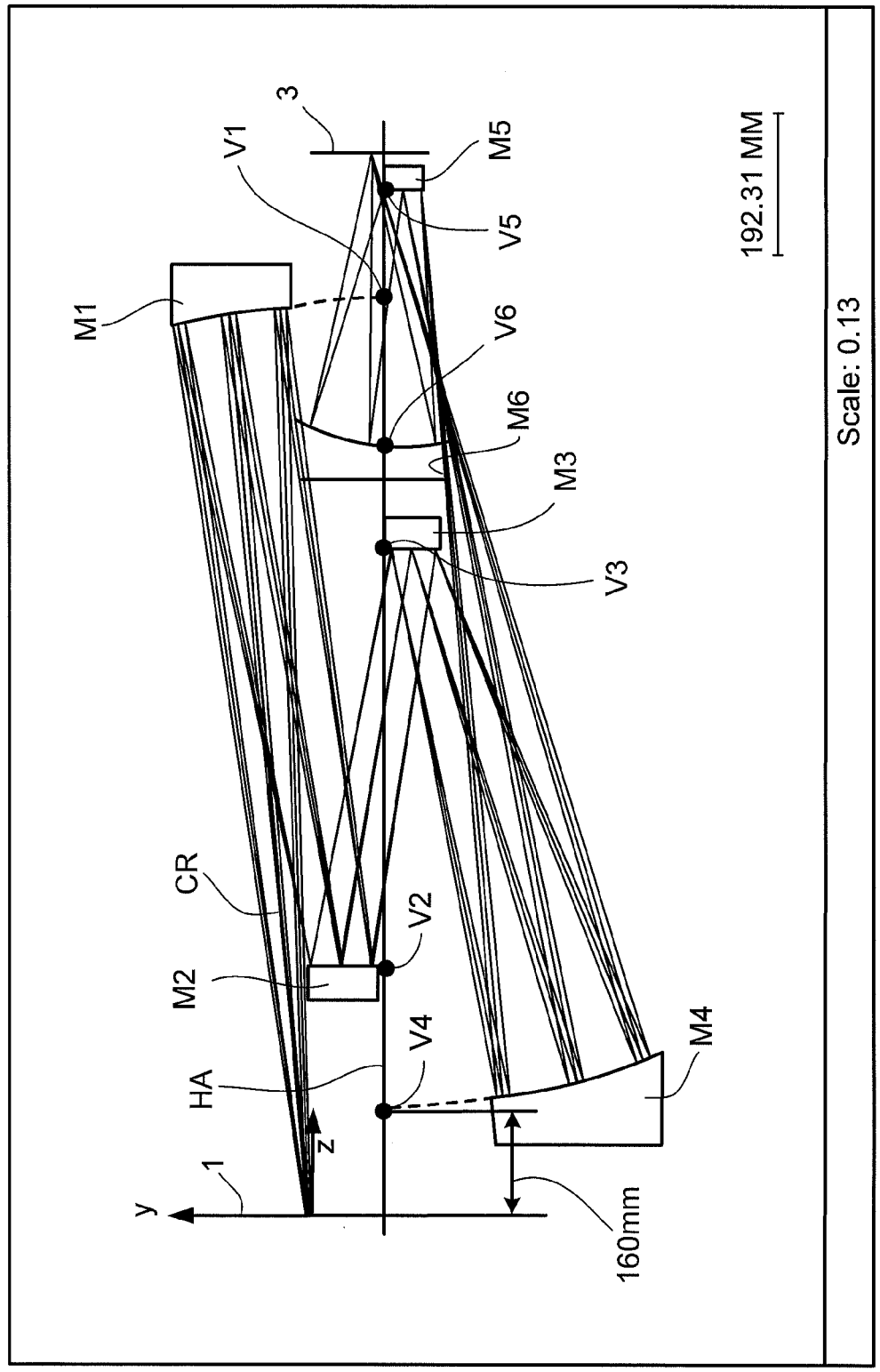
FIG. 6 shows a sixth embodiment of a projection system in accordance with the invention.

The optical data in Code-V-Format of the embodiment shown in FIG. 5 are given in Table 10:

The sixth embodiment as shown in FIG. 6 shows a six-mirror projection objective with a numeric aperture on the image side of NA=0.25 and a image side scan slit length of 2 mm. The system has a residual error of the wave front of merely 0.006λ and a maximum value of the chief ray distortion of 0.4 nm.

Although in this embodiment the distance between the object plane and the mirror closest to the reticle (which in this case is the fourth mirror M4) is merely 160 mm, the distance between the object plane and the mirror M2 which is relevant for the coupling of the illumination system by a grazing-incidence mirror is sufficiently large. The distance between the fourth mirror M4 and the object plane 1 is the distance between the vertex V4 of the fourth mirror M4 and the object plane 1. In combination with this property the system has very small incidence angles. This is achieved in way that the mirrors M2, M3 and M6 are arranged spatially between the mirrors M1 and M4 and the stop B is arranged in a light path 10000 from an object plane 1 to an image plane 3 between the two mirrors M2 and M3.

TABLE 10

| Surface | Radius | Thickness | Mode |
| --- | --- | --- | --- |
| Object | INFINITY | 1587.335 | |
| Mirror 1 | −1913.856 | −920.839 | REFL |
| Mirror 2 | 58877.612 | 416.135 | REFL |
| STOP | INFINITY | 204.704 | |
| Mirror 3 | 479.31 | −520.838 | REFL |
| Mirror 4 | 818.846 | 1052.583 | REFL |
| Mirror 5 | 568.772 | −381.744 | REFL |
| Mirror 6 | 486.596 | 456.139 | REFL |
| Image | INFINITY | 0.000 | |

| Surface | K | A | B | C |
| --- | --- | --- | --- | --- |
| Mirror 1 | 0.00000E+00 | −8.23289E−12 | −2.06649E−18 | −1.21116E−23 |
| Mirror 2 | 0.00000E+00 | −2.83691E−10 | 3.84161E−16 | −6.54727E−21 |
| Mirror 3 | 0.00000E+00 | −2.51352E−09 | −3.85388E−15 | −1.45162E−19 |
| Mirror 4 | 0.00000E+00 | 1.41651E−12 | 3.43852E−18 | 3.04348E−23 |
| Mirror 5 | 0.00000E+00 | 3.94130E−09 | 1.43298E−13 | −3.08533E−18 |
| Mirror 6 | 0.00000E+00 | 4.69285E−11 | 2.87650E−16 | 1.36780E−21 |

| Surface | D | E | F | G |
| --- | --- | --- | --- | --- |
| Mirror 1 | 2.12977E−29 | −2.19539E−35 | 0.00000E+00 | 0.00000E+00 |
| Mirror 2 | 5.21380E−26 | −3.02574E−31 | 0.00000E+00 | 0.00000E+00 |
| Mirror 3 | 8.55720E−24 | −1.68324E−28 | 0.00000E+00 | 0.00000E+00 |
| Mirror 4 | −9.83191E−29 | 2.87979E−34 | 0.00000E+00 | 0.00000E+00 |
| Mirror 5 | 2.16212E−22 | −1.03037E−26 | 0.00000E+00 | 0.00000E+00 |
| Mirror 6 | 5.81264E−27 | 4.31215E−32 | 0.00000E+00 | 0.00000E+00 |

Incidence angles, asphericities and gradients are shown here too in the following Table 11.

TABLE 11

Asphericity, aspheric gradient and incidence angle of the embodiment shown in FIG. 6

| Mirror | Incidence angle [°] of the chief ray CR | Asphericity [μm] | Gradient [μm/mm] |
|---|---|---|---|
| 1 | 2.60 | 27.8 | 0.81 |
| 2 | 10.97 | 25.0 | 1.51 |
| 3 | 14.58 | 21.6 | 2.09 |
| 4 | 3.16 | 3.9 | 0.10 |
| 5 | 9.92 | 8.3 | 1.36 |
| 6 | 3.93 | 3.9 | 0.23 |

This embodiment shown in FIG. 6 is characterized especially by low values for incidence angle, asphericity and gradient and by very favorable correction of the aberrations.

The following Table 12 shows the optical data in Code-V-Format of the embodiment in FIG. 6:

TABLE 12

| Surface | Radius | Thickness | Mode |
|---|---|---|---|
| Object | INFINITY | 1297.896 | |
| Mirror 1 | −1710.759 | −937.896 | REFL |
| Mirror 2 | −20144.339 | 383.041 | REFL |
| STOP | INFINITY | 204.855 | |
| Mirror 3 | 573.977 | −787.896 | REFL |
| Mirror 4 | 1097.742 | 1295.000 | REFL |
| Mirror 5 | 505.029 | −357.104 | REFL |
| Mirror 6 | 438.937 | 402.104 | REFL |
| Image | INFINITY | 0.000 | |

| Surface | K | A | B | C |
|---|---|---|---|---|
| Mirror 1 | 0.00000E+00 | −1.26954E−11 | −7.30013E−18 | −3.27967E−25 |
| Mirror 2 | 0.00000E+00 | −4.35401E−10 | 1.56374E−16 | −6.96961E−21 |
| Mirror 3 | 0.00000E+00 | −2.69520E−09 | −1.26211E−15 | −6.87646E−20 |
| Mirror 4 | 0.00000E+00 | 6.64628E−13 | 1.20144E−18 | 1.30354E−25 |
| Mirror 5 | 0.00000E+00 | 7.40754E−09 | 2.23400E−13 | −4.11171E−20 |
| Mirror 6 | 0.00000E+00 | 4.76780E−11 | 4.15223E−16 | 2.28398E−21 |

| Surface | D | E | F | G |
|---|---|---|---|---|
| Mirror 1 | −1.22004E−29 | 0.00000E+00 | 0.00000E+00 | 0.00000E+00 |
| Mirror 2 | −3.12632E−27 | 0.00000E+00 | 0.00000E+00 | 0.00000E+00 |
| Mirror 3 | 3.13115E−24 | 0.00000E+00 | 0.00000E+00 | 0.00000E+00 |
| Mirror 4 | 3.28031E−30 | 0.00000E+00 | 0.00000E+00 | 0.00000E+00 |
| Mirror 5 | −6.02609E−23 | 0.00000E+00 | 0.00000E+00 | 0.00000E+00 |
| Mirror 6 | 2.09323E−26 | 0.00000E+00 | 0.00000E+00 | 0.00000E+00 |

For all embodiments shown in FIGS. 1 to 6 the wavelength λ is 13.5 nm.

Figure 7:
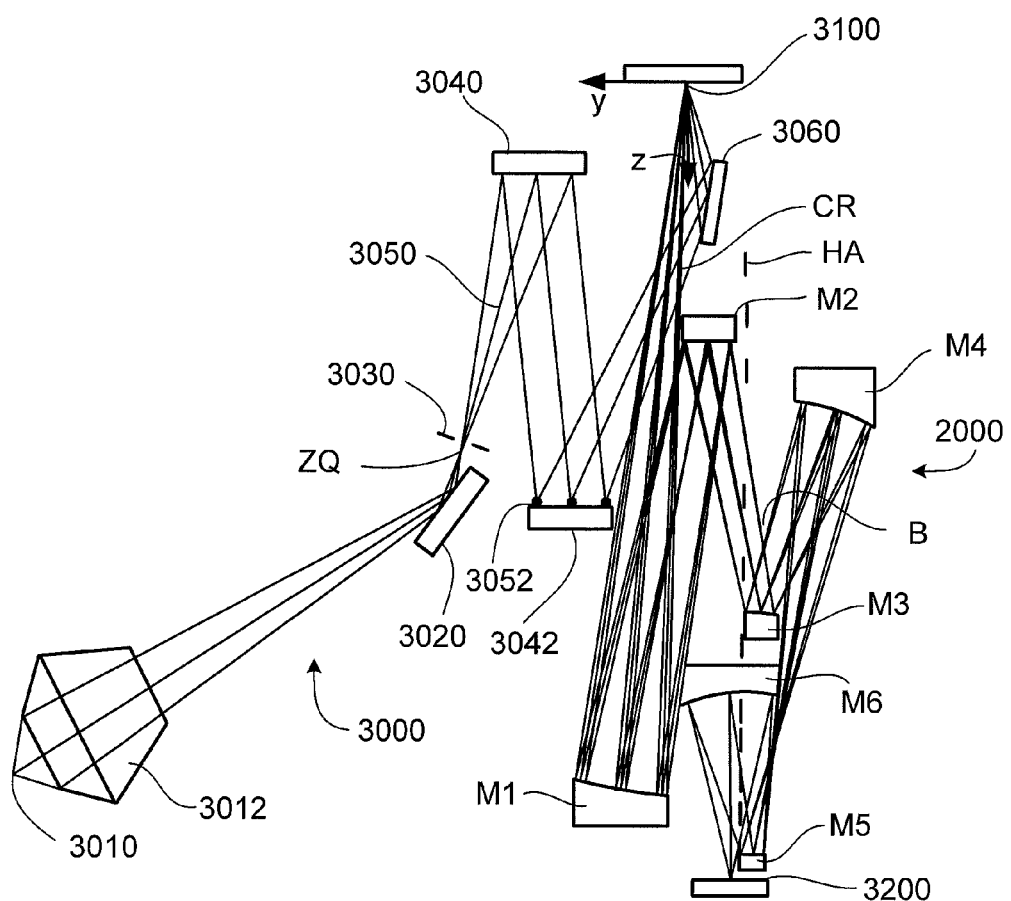
FIG. 7 shows a projection exposure system.

FIG. 7 shows the configuration of a projection exposure system with a projection system in accordance with the invention with a negative intersection distance or intercept distance.

The six-mirror projection objective is designated with reference numeral 2000 and the illumination system with reference number 3000. The six-mirror projection system is preferably an objective according to FIG. 1 through 6. FIG. 7 shows an embodiment with a projection system according to FIG. 1. It is exemplary and shall not be limiting in any way. Systems with an objective according to one of the FIGS. 2 to 6 are provided with substantially the same configuration and can be obtained by the person skilled in the art without any inventive measures.

The illumination system 3000 comprises a light source 3010 and a grazing-incidence collector 3012 as has been described in EP 1 225 481 for example. This is followed by a spectral filter element 3020 which can be configured as a diffractive spectral filter. In combination with a stop 3030 close to the intermediate image ZQ of the light source it is thus possible that undesired radiation with wavelengths substantially higher than the desired wavelength does not enter the part of the illuminating system situated behind the stop 3030. A first rastered mirror with first raster elements, so-called field mirror facets 3040 for a system in the EUV-wavelength region with e.g. a wavelength λ of 13.5 nm after the diffractive spectral filter 3020. The field facets divide a beam bundle 3050 impinging from the spectral filter into a plurality of individual beam bundles with an associated secondary light source each. The secondary light sources 3052 come to lie close to the individual raster elements of the second rastered mirror. The raster elements of the second rastered mirror 3042 are designated as pupil mirror facets in case of a system designed for wavelengths in the EUV-wavelength region, preferably between 1 to 20 nm.

Double-faceted illumination systems have become known from U.S. Pat. No. 6,195,201, in which so-called field raster elements or field facets have the shape of the field to be illuminated in the object plane and thus determine the shape of the field in the object plane. When the field in the object plane is in the shape of a circular arc, the field facets are also provided with an arc-shaped configuration.

As an alternative, the field raster elements can be rectangular. Such an illumination system is shown in U.S. Pat. No. 6,198,793. The shaping of the field is made in this illumination system with the help of a field-forming mirror.

The object plane 3100 in which the field is formed coincides with the object plane of the projection objective. It projects the field in the object plane into a field in the image plane 3200. The projection system concerns a projection system according to the embodiment of FIG. 1. Accordingly, the mirrors are designated with the same reference numerals as in the embodiment of FIG. 1, thus the mirror which is first in the light path is designated with reference numeral M1.

A substrate with a light-sensitive layer, e.g. a wafer, can be arranged in the image plane 3200 of the projection system.

The projection exposure system as shown in FIG. 7 is characterized in that the chief rays enter the entrance pupil of the projection objective or projection system in a divergent manner. In such a system the entrance pupil of the projection system coincides with the exit pupil of the illumination system. A system with the chief rays entering the projection objective or projection system in a divergent manner has a negative intersection distance and the entrance pupil (not shown) of the projection objective or projection system is reflected at the object plane 3100 and the reflected entrance pupil is arranged in front of the object plane 3100 in the light path from the light source to the object plane 3100.

Concerning projection systems with a negative intersection distance, reference is hereby made to WO 2004/010224, the scope of disclosure of which is hereby fully included in the present invention.

As a result of the large distance of the object plane on the next closest mirror (which in the case shown is mirror M2), there is sufficient space for the coupling mirror 3060 which guides the light of the illumination system into the projection objective or projection system. In this case, the coupling mirror 3060 is arranged as a grazing-incidence mirror. This mirror 3060 can provide for the field formation, but it need not necessarily do so.

Figure 8:
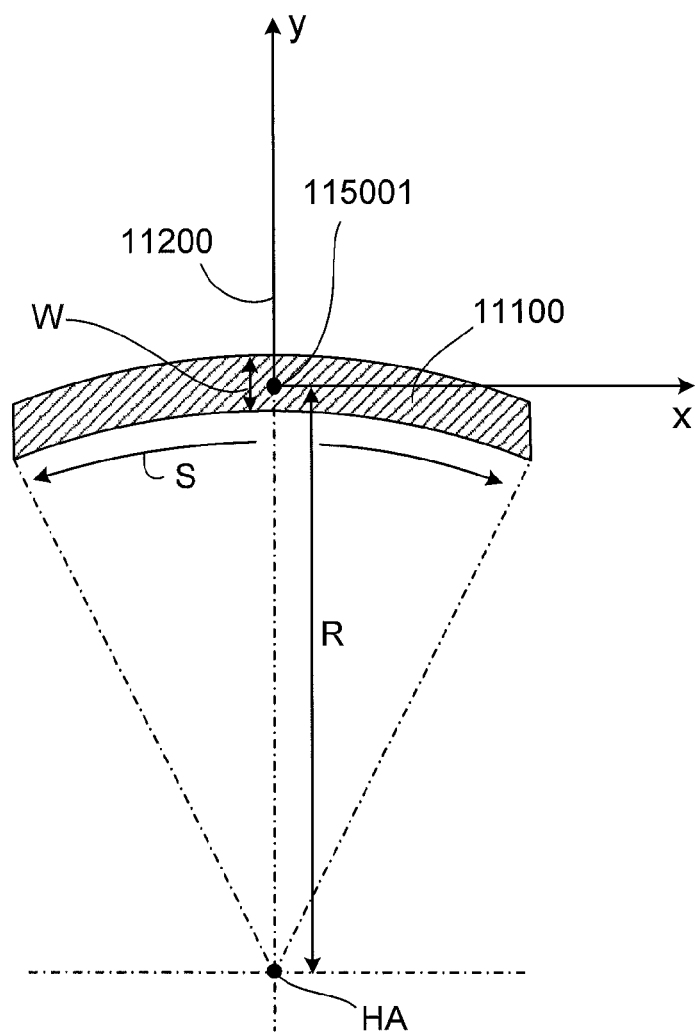
FIG. 8 shows a ring field.

In FIG. 8 the object field 11100 of a projection exposure apparatus in the object plane of the projection system is shown. The image field in the image plane has the same shape as the object field in the object plane but with the reduced size according to the demagnification ratio of the projection system. The object or the image field 11100 has the configuration of a segment of a ring field, in case the projection exposure apparatus is a ring field scanner and the ring field has an axis of symmetry 11200.

In addition, to the axis of symmetry 11200, the x-axis and the y-axis of a x-, y-, z-coordinate system in the central field point 11500 of the ring field 11000 is depicted. As can be seen from FIG. 1, the axis of symmetry 11200 of the ring field runs in the direction of the y-axis. The y-axis coincides with the scanning direction of a projection exposure apparatus, which is designed as a ring field scanner. The x-direction is thus the direction that is perpendicular to the scanning direction, within the object plane. The ring field has a so-called ring field radius R, which is defined by the distance of the central field point 11500 of the object field from the optical axis (HA) of the projection system. The arc-shaped field in the image plane as well as in the object plane has a field width W, the so called scan-slit length, which is the extension of the field in scanning or y-direction and a secant length S. The field can be divided in a plurality of field points. In FIG. 8 as a representation for the plurality of field points only the central field point 11500 is shown. From each field point a light-bundle with a chief ray (not shown) emanates.

The projection exposure system in accordance with the invention can be used to produce a microelectronic component by successive exposure of one or several light-sensitive layers and their subsequent development.

The invention claimed is:

1. A projection system for guiding light from an object plane to an image plane, the projection system comprising:
at least a first mirror, a second mirror, a third mirror, a fourth mirror, a fifth mirror and a sixth mirror centered around an optical axis and arranged along the optical axis, so that during use the light travels from the object plane to the first mirror, then from the first mirror to the second mirror, then from the second mirror to the third mirror, then from the third mirror to the fourth mirror, then from the fourth mirror to the fifth mirror and then from the fifth mirror to the sixth mirror, wherein
the third mirror, the fourth mirror and the sixth mirror are arranged along the optical axis geometrically between the first mirror and the second mirror, the projection system has an image side numerical aperture greater than 0.2, and the projection system is configured to be used with wavelengths less than 193 nm.

2. A projection system configured to guide light from an object plane to an image plane, the projection system comprising:
exactly six mirrors,
wherein:
the six mirrors are a first mirror, a second mirror, a third mirror, a fourth mirror, a fifth mirror and a sixth mirror centered around an optical axis of the projection system and arranged along the optical axis of the projection system, so that, during use of the projection system, the light travels from the object plane to the first mirror, then from the first mirror to the second mirror, then from the second mirror to the third mirror, then from the third mirror to the fourth mirror, then from the fourth mirror to the fifth mirror and then from the fifth mirror to the sixth mirror;
the third mirror, the fourth mirror and the sixth mirror are arranged along the optical axis geometrically between the first mirror and the second mirror;
the projection system has an image side numerical aperture greater than 0.2;
the projection system is configured to be used with wavelengths less than 193 nm; and
the projection system is configured to be used in microlithography.

3. A projection system according to claim 2, wherein during use a chief ray to a central field point impinges upon the first mirror under an incidence angle and the incidence angle is <4° on the first mirror relative to a normal of a mirror surface of the first mirror.

4. A projection system according to claim 2, wherein during use a chief ray to a central field point impinges upon the second mirror under an incidence angle and the incidence angle is <14° on the second mirror relative to a normal of a mirror surface of the first mirror.

5. A projection system according to claim 2, wherein during use a chief ray to a central field point impinges upon the third mirror under an incidence angle and the incidence angle is <18° on the third mirror relative to a normal of a mirror surface of the third mirror.

6. A projection system according to claim 2, wherein the projection system has the image side numerical aperture and the image-side numerical aperture is greater than 0.25.

7. A projection system according to claim 2, wherein a stop is disposed between the second and the third mirror.

8. A projection system according to claim 7, wherein the stop is an accessible stop.

9. A projection system according to claim 2, wherein the second mirror is either a plane or convex or concave mirror.

10. A projection system according to claim 2, wherein the third mirror is a convex mirror.

11. A projection system according to claim 2, wherein the fourth mirror is a concave mirror.

12. A projection system according to claim 2, wherein the fifth mirror is a convex mirror.

13. A projection system according to claim 2, wherein the sixth mirror is a concave mirror.

14. A projection system according to claim 2, wherein the first mirror is a concave mirror.

15. A projection exposure system, comprising:
an illumination system configured to illuminate an object in an object plane; and
a projection objective configured to image the object in the object plane into an image in an image plane,
wherein:
the projection objective comprises exactly six mirrors;
the six mirrors are a first mirror, a second mirror, a third mirror, a fourth mirror, a fifth mirror and a sixth mirror centered around an optical axis of the projection system and arranged along the optical axis of the projection system, so that, during use of the projection system, the light travels from the object plane to the first mirror, then from the first mirror to the second mirror, then from the second mirror to the third mirror, then from the third mirror to the fourth mirror, then from the fourth mirror to the fifth mirror and then from the fifth mirror to the sixth mirror;
the third mirror, the fourth mirror and the sixth mirror are arranged along the optical axis geometrically between the first mirror and the second mirror;
the projection system has an image side numerical aperture greater than 0.2;
the projection exposure system is designed to be used with wavelengths less than 193 nm; and
the projection exposure system is a microlithography projection exposure system.

16. A method, comprising:
a) projecting a structured mask onto a light-sensitive layer situated in the image plane of a projection objective via a projection exposure system to form an exposed light-sensitive layer; and
b) after a), developing the exposed light sensitive layer, resulting in at least a part of a microelectronic component,
wherein:
the projection objective comprises exactly six mirrors;
the six mirrors are a first mirror, a second mirror, a third mirror, a fourth mirror, a fifth mirror and a sixth mirror centered around an optical axis of the projection system and arranged along the optical axis of the projection system, so that, during use of the projection system, the light travels from the object plane to the first mirror, then from the first mirror to the second mirror, then from the second mirror to the third mirror, then from the third mirror to the fourth mirror, then from the fourth mirror to the fifth mirror and then from the fifth mirror to the sixth mirror;
the third mirror, the fourth mirror and the sixth mirror are arranged along the optical axis geometrically between the first mirror and the second mirror;
the projection system has an image side numerical aperture greater than 0.2; and
the projection system is configured to be used with wavelengths less than 193 nm.

* * * * *

UNITED STATES PATENT AND TRADEMARK OFFICE
CERTIFICATE OF CORRECTION

| | | |
|---|---|---|
| PATENT NO. | : 7,973,908 B2 | Page 1 of 1 |
| APPLICATION NO. | : 11/913598 | |
| DATED | : July 5, 2011 | |
| INVENTOR(S) | : Hans-Juergen Mann | |

It is certified that error appears in the above-identified patent and that said Letters Patent is hereby corrected as shown below:

Column 2, Line 30, delete "form" insert --from--;

Column 2, line 43, delete "form" insert --from--;

Column 2, Line 45, delete "form" insert --from--;

Column 5, Line 14, delete "emanting" insert --emanating--.

Signed and Sealed this
Fourth Day of October, 2011

David J. Kappos
*Director of the United States Patent and Trademark Office*